United States Patent [19]

Geewala

[11] 4,117,354

[45] Sep. 26, 1978

[54] TWO-PART CURRENT INJECTION INTERFEROMETER AMPLIFIERS AND LOGIC CIRCUITS

[75] Inventor: Tushar Ramesh Geewala, Yorktown Heights, N.Y.

[73] Assignee: International Business Machines Corporation, Armonk, N.Y.

[21] Appl. No.: 811,733

[22] Filed: Jun. 30, 1977

[51] Int. Cl.² .......................................... H03K 19/195
[52] U.S. Cl. .................................. 307/306; 307/212; 307/277
[58] Field of Search ............... 307/212, 245, 277, 306, 307/218

[56] References Cited

U.S. PATENT DOCUMENTS 3,281,609  10/1966  Rowell ........................... 307/306 X

OTHER PUBLICATIONS

W. Anacker et al., "Double Flux Quantum Cell without Bias Line" IBM Technical Disclosure Bulletin vol. 19, No. 3, Aug. 1976, pp. 1096–1097.

F. Basavaiah, "Shaping the Gate Current Versus the Control Characteristics of Nonlinear Gates" IBM Technical Disclosure Bulletin vol. 15, No. 5, Oct. 1972, pp. 1604–1605.

T. A. Fulton et al., "A Josephson Logic Design Employing Current Switched Junction" IEEE Transactions on Magnetics vol. MAG-13, No. 1, Jan. 1977, pp. 56–58.

J. Clarke et al., "Josephson Junction Amplifier" Applied Physics Letters vol. 19, No. 11, Dec. 1, 1971, pp. 469–471.

*Primary Examiner*—John Zazworsky
*Attorney, Agent, or Firm*—Thomas J. Kilgannon, Jr.

[57] ABSTRACT

Josephson junction interferometers having nonlinear switching or threshold characteristics are disclosed. The nonlinear threshold characteristic is achieved in a preferred manner by applying an injection current to the interferometer at a point on the interferometer which is different from where its gate current is normally applied. The resulting nonlinearity provides for high amplification. The nonlinear switching characteristic may also be achieved by applying an injection current to the same point on the interferometer where the gate current is normally applied. However, a portion of the thus-applied injection current is electromagnetically coupled to the interferometer inductance to achieve the desired nonlinear switching characteristic. Parameters such as the injection current, the gate current, physical point of application of the injection current to the interferometer, junction currents and the inductance of the interferometer may be changed to tailor the threshold characteristic to provide a desired nonlinearity. Logic circuits such as AND, OR and INHIBIT circuits in addition to the basic amplifier circuit are also disclosed.

34 Claims, 12 Drawing Figures

TWO-PART CURRENT INJECTION INTERFEROMETER AMPLIFIERS AND LOGIC CIRCUITS

BACKGROUND OF THE INVENTION

1. Field of the Invention

This invention relates generally to superconducting quantum interference devices known as interferometers which have a nonlinear threshold or switching characteristic. It further relates to interferometers which, as a result of their nonlinear gain characteristics, are capable of providing greater amplification than that attainable using prior art interferometers. More specifically, it relates to interferometer circuits having nonlinear gain characteristics which may be tailored in such a way as to provide logic outputs such as AND, OR. In a preferred basic amplifier circuit, a two-junction interferometer can achieve high gain by injecting current into the interferometer at a point which is different from that where the normal gate current is applied to an interferometer. The injection current is applied at the same time as the gate current and, in a complex way, provides a nonlinear switching or threshold characteristic which, relative to known interferometers, provides a greater gain.

In another embodiment, greater amplification can be achieved by magnetic field enhancement. Magnetic field enhancement is achieved by injecting current at a point different from that where the gate current is applied and simultaneously electromagnetically coupling a portion of the injected current to the inductance of the interferometer. In this manner, gains of up to ten can be achieved.

In other embodiments, AND and OR circuits can be obtained by tailoring the gain characteristic so that substantially equal magnitude inputs produce the desired logic output.

While two and three-junction interferometers are shown, it should be appreciated that any multi-junction interferometer may also be utilized. Further, there is no limitation on the number of currents which may be injected into an interferometer at points other than that to which the gate current is applied. In all events, whether the injected current be a directly injected or one which is electromagnetically coupled to the interferometer, all the means for producing a nonlinear gain characteristic are directly connected to the interferometer.

2. Description of the Prior Art

Josephson junction devices are well-known in the prior art where they are utilized both as memory devices in storage arrays and as switching devices in ultrahigh-speed logic circuits.

The injection of current into Josephson junction devices to produce a substantially linear switching or threshold characteristic is shown in U.S. Pat. No. 3,281,609 filed Jan. 17,1964, Ser. No. 338,467, in the name of J. M. Rowell. The patent shows logic gates which perform AND and OR functions using a current which is similar to the gate current of the present application and an injection current similar to that utilized in the present application. This reference can be distinguished over in that the present application provides circuit arrangements which have nonlinear threshold characteristics. The threshold characteristics of Rowell are substantially linear in character.

An article entitled "A Josephson Logic Design Employing Current Switched Junction" by T. A. Fulton et al. in the *IEEE Transactions on Magnetics*, Vol. MAG-13, No. 1, January 1977, p. 56 shows an application of the linear current injection scheme of the above patent.

An article in *Applied Physics Letters*, Vol. 19, No. 11, p. 469, Dec. 1, 1971, entitled "Josephson Junction Amplifier" by J. Clarke et al. shows a double junction interferometer which achieves current amplification using positive feedback. In the arrangement shown, a bias current is fed asymmetrically to the junctions of the interferometer. A magnetic flux is applied to the interferometer either from an external source or alternatively by means of a current in the upper arm of the interferometer. While this current could be said to be an injected current, this is not so because it is strictly confined to the upper arm of the interferometer to supply a magnetic field. This becomes clear when it is observed that the current applied to the one side of the upper arm of the interferometer is withdrawn from the upper arm of the interferometer at the opposite side of the upper arm. All this amounts to is an expedient for applying a magnetic field to the interferometer inducing a flux into the interferometer ring circuit. The resulting threshold characteristic would be linear in character.

*IBM Technical Disclosure Bulletin*, Vol. 15, No. 5, October 1972, p. 1604, in an article entitled "Shaping the Gate Current Versus the Control Current Characteristics of Nonlinear Josephson Gates" by F. Basavaiah shows the application of a gate current and a control signal to a Josephson gate. A portion of the gate current is fed back antiparallel to the direction of the gate current. By introducing the feedback, the slope as well as the shape of the threshold characteristic can be significantly changed. Even though the slope as well as the general shape of the threshold characteristic are changed, the relationship between the gate and control current is still preserved. The circuit uses no directly injected or coupled current other than a gate current.

*IBM Technical Disclosure Bulletin*, Vol. 19, No. 3, August 1976, p. 1096 in an article entitled "Double Flux Quantum Cell Without Bias Line" by W. Anacker et al. there is shown an interferometer which in FIG. 2 appears to schematically show an injected current. This is not an injected current but rather is a schematic representation for a control current being coupled to the interferometer.

Swiss Pat. No. 580,365 issued Aug. 15, 1976 and assigned to the same assignee as the present invention shows a single Josephson junction into which a plurality of currents are introduced. To the extent that these currents could be said to be injected into a junction, they are all summed in the same manner as if an interferometer were fed with a single gate current which is the sum of all the applied currents. In addition, for the logic circuits shown all the current supplied to the logic circuits are applied linearly such that $I_{Bo} + I_A + I_B \geq I_{mo}$. The arrangements shown exhibit no nonlinearities.

An article in *Applied Physics Letters*, Vol. 20, No. 11, June 1, 1972, p. 456, entitled "Three-Josephson-Junction Interferometer" by D. L. Steuhm et al. shows an asymmetrically fed three-Josephson-junction interferometer to which a magnetic field is applied in the usual manner. Such arrangements do not exhibit linear threshold characteristics similar to those of the present application because there is no injected current in addition to the gate current. The latter is asymmetrically introduced in the reference.

As can be seen from the foregoing, the use of interferometers with control lines and the injection of current into single junctions is well-known. However, none of the arrangements of the prior art produces a nonlinear threshold or switching characteristic similar to that provided by the interferometers of the present application. It thus appears that the prior art is limited in the amplification mode to relatively low gains as compared with the arrangements of the present application. It further appears that all known interferometers utilize a control line to accomplish both switching and logic functions. The present invention eliminates the need for any control lines.

SUMMARY OF THE INVENTION

In accordance with the broadest aspect of the present invention, a Josephson tunneling circuit is utilized which includes an interferometer having at least a pair of junctions which are capable of carrying Josephson current and which has at least an inductance interconnecting the junctions. It further includes means directly coupled to the interferometer for generating a nonlinear switching characteristic.

In accordance with broader aspects of the present invention, a Josephson tunneling circuit is utilized wherein the means directly connected to the interferometer for generating a nonlinear switching characteristic includes means for applying a gate current to at least a given point on the interferometer and further includes means for applying at least an injection current to at least a point on the interferometer which is different from the given point.

In accordance with still broader aspects of the present invention, a Josephson tunneling circuit is utilized wherein the means directly connected to the interferometer includes means for applying a gate current to at least a given point on the interferometer and further includes means for simultaneously applying at least an injection current to said at least a given point. It further includes means for inducing at least an additional current from said at least an injection current into at least a portion of said at least an inductance.

In accordance with still broader aspects of the present invention, a Josephson tunneling circuit is provided wherein said means directly connected to the interferometer includes means for applying a gate current to said at least a given point on the interferometer, and, means for simultaneously applying at least an injection current to at least a point on the interferometer different from said given point. It further includes means for inducing at least an additional current from said at least an injection current into at least a portion of said at least an inductance.

In accordance with more specific aspects of the present invention, a Josephson tunneling circuit is provided which further includes a load impedance shunting the interferometer.

In accordance with still more specific aspects of the present invention, a Josephson tunneling circuit is provided which further includes means connected to the generating means for applying currents of substantially the same amplitude to said interferometer.

In accordance with still more specific aspects of the present invention, a Josephson tunneling circuit is provided which further includes means connected to the generating means for applying currents of different amplitude to the interferometer.

In accordance with yet still more specific aspects of the present invention, a Josephson tunneling circuit is provided wherein the given point is on the inductance and splits the inductance symmetrically.

In accordance with yet more specific aspects of the present invention, a Josephson tunneling circuit is provided wherein the given point is on the inductance and splits the inductance asymmetrically.

It is, therefore, an object of this invention to provide multi-junction interferometers which have nonlinear gain characteristics.

Another object is to provide interferometers which have nonlinear gain characteristics which can be utilized as amplifiers and logic circuits.

Still another object is to provide interferometers with nonlinear gain characteristics which, in their amplification mode, have greater amplifications than prior art interferometers.

Still another object is to provide interferometers which have nonlinear gain characteristics which do not require the use of conventional control lines for switching.

Yet another object is to provide a basic interferometer, the parameters of which may be tailored to provide both amplifier and logic circuits such as AND, OR logic circuits.

The foregoing and other objects, features and advantages of the present invention will become apparent from the following more particular description of a preferred embodiment of the invention as illustrated in the accompanying drawings.

BRIEF DESCRIPTION OF THE DRAWINGS

FIG. 2B shows the switching or threshold characteristic for a three-junction interferometer which utilizes nonlinear current injection to provide amplification and also shows the switching or threshold characteristic of a two-junction interferometer which achieves its amplification by a combination of current injection and electromagnetic coupling to the inductances of the interferometer. The threshold or switching characteristic of the circuit of FIG. 1A is included for purposes of easy comparison.

In FIG. 3, a field-enhanced, nonlinear injection arrangement is shown in dashed lines to show another means in addition to the straightforward non-field-enhanced nonlinear injection, for achieving amplification in multijunction interferometers.

FIG. 4B indicates that depending on the polarity of the signals applied and the logic function being sought at an output, an AND logic function can be achieved using nonlinear current injection.

DESCRIPTION OF THE PREFERRED EMBODIMENTS

In the development of Josephson technology, three approaches have been suggested up to now for the achievement of amplification in Josephson devices and circuits. One approach utilizes multiple control loops to achieve amplification. This approach, however, suffers from high load inductance which increases as the square of the number of turns in the control loops. Another method is aimed toward achieving a highgain interferometer by the proper selection of feed points, $LI_o$ product and the current ratios. The split feed interferometer with a 1:2:1 current ratio as described in U.S. Pat. No. 3,978,351, Ser. No. 592,000, filed June 30, 1975 and assigned to the same assignee as the present invention has the best gain-margin characteristics among all three-junction interferometers. However, depending upon margin constraints, the best gains achievable are limited to slightly in excess of 2.

Figure 1A:
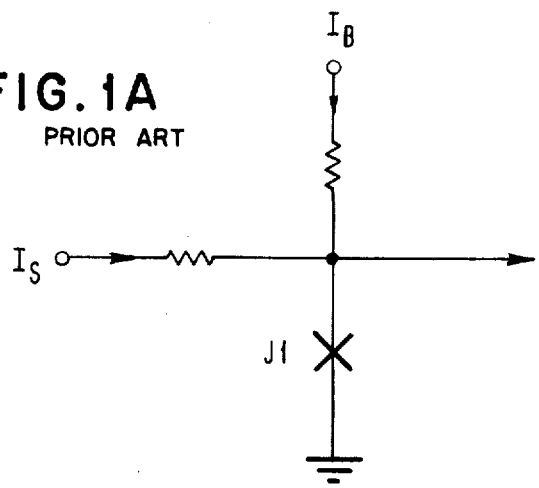
FIG. 1A is a schematic diagram of a prior art linear current injection amplifier which incorporates a Josephson junction as a switchable device.

FIG. 1A shows a third approach to achieving amplification in circuits which utilize Josephson devices. FIG. 1A is a schematic representation of a prior art circuit which utilizes linear current injection to switch a Josephson device. In FIG. 1A, a Josephson junction or interferometer J1 is biased or enabled in the superconducting state by applying a current $I_B$ to device J1. When a signal current, $I_S$ is injected into the same device J1 so that the threshold current, $I_{mo}$, is exceeded, device J1 switches and a current gain given by $(I_B+I_S)/I_S$ is obtained. U.S. Pat. No. 3,281,609, Ser. No. 338,467, filed Jan. 17, 1974 in the name of J. M. Rowell utilizes this linear current injection approach. Using the linear current injection approach, gains slightly in excess of two per stage can be achieved.

Figure 1B:
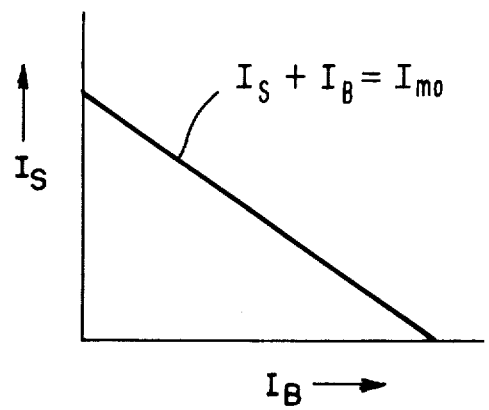
FIG. 1B is a graphical representation of $I_S$ versus $I_B$ showing the linear threshold or switching characteristic of the circuit of FIG. 1A.

FIG. 1B is a graphical representation of $I_S$ versus $I_B$ showing the switching or threshold characteristic of the circuit of FIG. 1A. The linear relationship between the parameters is quite clear and it is from this characteristic that the term linear current injection is derived.

Figure 2A:
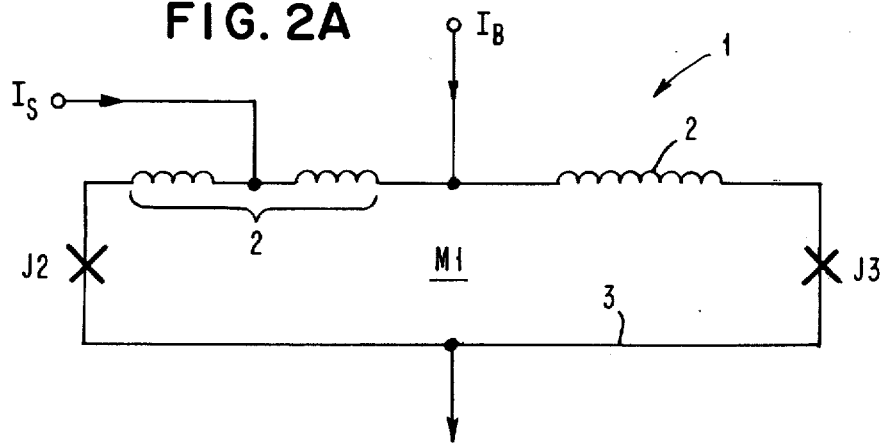
FIG. 2A is a schematic diagram of a two-junction interferometer which incorporates the nonlinear injection of a signal current along with a bias current, $I_B$, to provide an amplified output of greater gain than the gains achieved in prior art circuits.

The gains achieved using the linear current injection approach and the others mentioned above are not sufficient to meet the requirements of many applications contemplated in integrated circuits which use Josephson technology. Higher gains are, in general, required to improve speed, margins and noise immunity in a practical logic family. In addition, there are serious needs for amplification in logic-to-memory interfaces, off-chip drivers, amplifiers and self-resetting logic. These needs have been met by the nonlinear injection amplifier, a schematic of which is shown in FIG. 2A and which incorporates a two junction interferometer. Amplifiers of the character to be described in what follows achieve nominal gains of 10 by using a nonlinear switching response between the applied gate and signal currents.

Referring now to FIG. 2A in more detail, there is shown a schematic diagram of a two-junction interferometer to which two currents $I_B$, and $I_S$ are applied in such a way as to provide a nonlinear interaction between the currents and fluxes produced. In FIG. 2A, two-junction interferometer 1 includes a pair of Josephson junctions J2, J3 which are interconnected in parallel via an interconnection which is inductive in character and is represented in FIG. 2A by a pair of inductances 2. Interferometer 1 is fed with a gate current, $I_B$, from a current source (not shown) and, in the absence of any other circumstance, current $I_B$ would distribute itself in inverse proportion to the values of inductances of the two parallel branches. To the extent that the current $I_B$ after splitting exceeds the threshold current $I_{mo}$ of the junctions J2, J3, the latter will switch from the zero voltage state to the voltage state in a well-known manner. When junctions J2, J3 are in the zero voltage state, current flow occurs across an insulator between two superconducting electrodes via the well-known phenomenon of Josephson tunneling. Interconnection 3 completes the parallel connection of junctions J2, J3 which together with inductances 2 form a loop M1. In FIG. 2A, an injection current, $I_S$, is shown being introduced at the midpoint of left-most inductance 2 to suggest the general situation of applying an additional current to interferometer 1 at a feed point other than that to which the gate current $I_B$ is applied. If current $I_S$ were to be applied at the same feed point as current $I_B$, there would merely be a summation of currents being applied to interferometer 1 in the manner of FIG. 1A providing a linear switching or threshold characteristic similar to that shown in FIG. 1B. Thus, to the extent that injection current $I_S$ is applied to loop M1 in a manner other than applying it to interferometer 1 along with current $I_B$, the injection current $I_S$ distributes itself around loop 1 in a different way from gate current $I_B$ and, in a complex way, these currents undergo a nonlinear interaction which provides a nonlinear switching or threshold characteristic similar to one of those shown in FIG. 2B. It has been determined relative to interferometer 1 of FIG. 2A, which can be now characterized as a three-terminal interferometer, that the current required to switch interferometer 1 at one feed-point is a nonlinear function of the current present at the other feed terminal. It has also been determined that this nonlinearity can within limits be controlled in a desired way by a proper choice of feed points, inductance values and junction currents.

Figure 2B:
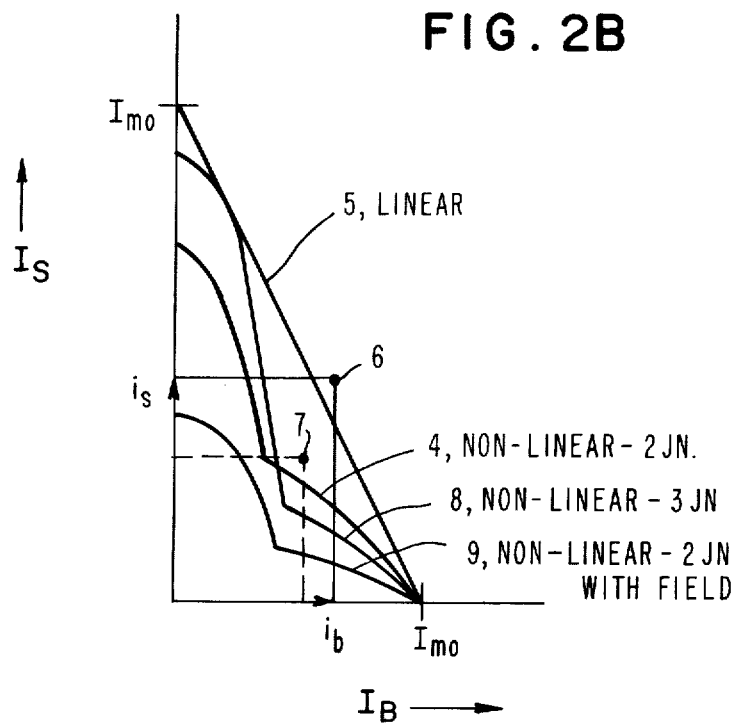
FIG. 2B is a graphical representation of a signal current, $I_S$ versus a bias current, $I_B$, which shows the threshold or switching characteristic of the amplifier of FIG. 2A. In addition.

It should be noted, at this point, that until now no mention has been made of any control lines in connection with the circuits or devices of FIGS. 1A, 2A. Neither of the arrangements shown utilizes control lines and, while the absence of a control line in FIG. 1A does not give rise to a nonlinear switching characteristic, a nonlinear switching characteristic is obtained without the use of a control line in interferometer 1 of FIG. 2A by injecting current $I_S$ at a point on interferometer loop M1 different from the point where the usual gate current $I_B$ is introduced. The nonlinear response achieved by injecting current $I_S$ into interferometer 1 is different from the nonlinear response achieved in interferometers which utilize a control field applied to such devices by a control line. The nonlinearity due to control fields is lost in overlapping modes and in fabrication margins. The present nonlinearity due to current injection does not suffer from overlapping modes and possesses sharper slopes. FIG. 2B shows the linear switching threshold for the circuit of FIG. 1A for comparision with a number of nonlinear threshold characteristics one of which is obtainable using the circuit of FIG. 2A. The other nonlinear switching characteristics shown are attributable to a three-junction interferometer which utilizes nonlinear current injection and to a three-junction interferometer which utilizes current injection simultaneously with magnetic field enhancement.

Referring now to FIG. 2B in more detail, a graphical representation of injection current, $I_S$, versus gate current, $I_B$, is shown for interferometer 1 of FIG. 2A which generates a nonlinear switching or threshold characteristic 4 which is otherwise identified therein by the caption "Nonlinear Two-Junction". The linear switching characteristic of the circuit if FIG. 1A is reproduced in FIG. 2B for purposes of comparison. This is shown in FIG. 2B at 5 and is otherwise identified in FIG. 2B by the caption "Linear". If one defines amplification in the context of digital circuits as the ratio of the output current to the current required to switch the device, one can achieve a higher gain by either increasing the output current or by reducing the current required to switch the device. Most applications attempt to reduce the current required to switch a device to achieve better amplification. The present application does the same but achieves the reduction in current by generating a nonlinear switching or threshold characteristic by current injection at a feed-point on the interferometer loop different from the feed-point where the usual gate current is introduced. Assuming for purposes of exposition that the gate current $I_B$ is the same for the arrangements of FIG. 1A, FIG. 2A. this value can be plotted in FIG. 2B on the $I_B$ axis as current $i_b$. The current $I_S$ which would be required to switch the circuit of FIG. 1A is shown in FIG. 2B as current $i_s$. Operating point 6 disposed outside of linear threshold characteristic 5 indicates that the currents applied have switched the circuit of FIG. 1A from the zero voltage state to the voltage state. Inspection of FIG. 2B clearly shows that there are any number of operating points available which are outside nonlinear switching characteristic 4 which is the switching characteristic of the circuit of FIG. 2A but within linear characteristic 5. For example, operating point 7 in FIG. 2B would permit the switching of the circuit of FIG. 2A from the zero voltage state to the voltage state using values of $I_S$ and $I_B$ which are both less than the current $i_{b, is}$ required to switch the device of FIG. 1A. The dashed lines emanating from operating point 7 in FIG. 2B clearly show that the currents required to switch interferometer 1 of FIG. 2A are less than the currents required to switch the circuit of FIG. 1A. From this, it should be clear that amplifications greater than prior art amplifications can be achieved due to nonlinearities generated in the circuit of FIG. 2A which provide a nonlinear switching characteristic which in turn permits a reduction in both the injected current $I_S$ and the gate current, $I_B$. It should also be clear from FIG. 2B that the greater the nonlinearities achieved, the greater will be the reduction in currents needed to switch a device and the greater will be the amplification obtained. Control of the nonlinearity of the threshold or switching characteristics can be achieved as indicated by nonlinear switching characteristics 8, 9 in FIG. 2B. These switching characteristics will be discussed in what follows in conjunction with the circuit arrangement shown in FIG. 3.

Typical values for the applied currents, values of inductance and junction parameters for the interferometer of FIG. 2A are as follows:
 $i_b$ = 250 micro-amps
 $i_s$ = 75 micro-amps
 Left-most inductance 2 = 7.5 pH
 Right-most inductance 2 = 3 pH
 $I_{mo}(J2)$ = 100 micro-amps
 $I_{mo}(J3)$ = 250 micro-amps
 Gain = 4

While the above values are not necessarily the optimum values, it should be appreciated that the feed point for injecting injection curent $I_S$ can be moved to any point on left-most inductance 2 of FIG. 2A to achieve different degrees of nonlinearity. It should also be appreciated that the values of the left-most and right-most inductances 2 can have different values and may be varied rather widely to also achieve the desired nonlinear switching characteristic. Finally, it should be further appreciated that the nonlinearities achieved are also a function of the current ratio in junctions J2, J3 and the gate current $I_B$. In general, however, gate current, $I_B$, should be fed to an interferometer in such a way as to obtain the highest possible value of $I_{mo}$. This provides for the largest margins on $I_B$. Also, the injection current $I_4$ should be fed to a point different from the gate current feed point so as to minimize the $I_{mo}$ of the device when both currents are being applied. This results in the highest switching sensitivity to injection current and results in very high gain.

Figure 3:
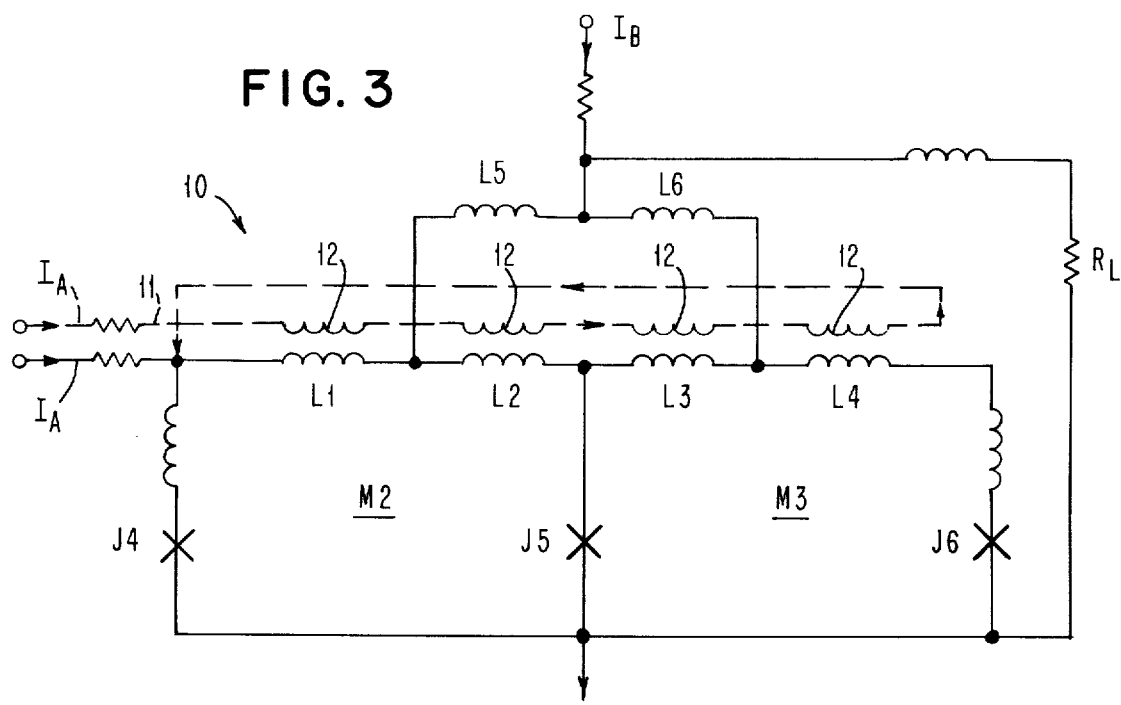
FIG. 3 is a schematic diagram of a symmetrically fed three-junction interferometer which utilizes nonlinear current injection in accordance with the teaching of the present invention.

Referring now to FIG. 3, there is shown therein a three-junction interferometer which applies gate current $I_B$ symmetrically to a pair of interferometer loops using a symmetrical split feed. Injection current $I_4$ is end fed, that is, it is applied at the left-most extremity of the interferometer device. The circuit arrangement of FIG. 3 introduces substantially more nonlinearity than the two-junction interferometer of FIG. 2A and has a threshold or switching characteristic similar to that shown at 8 in FIG. 2B. Characteristic 8 in FIG. 2B is otherwise identified therein as a "Nonlinear Three-Junction." Referring to FIG. 3 in more detail, the circuit is similar to that shown in FIG. 3B of U.S. Pat. No. 3,978,315, Ser. No. 592,000, filed June 30, 1975 and assigned to the same assignee as the present invention. The present FIG. 3 has the same configuration as FIG. 3B of U.S. Pat. No. 3,978,315 except that instead of using a control line which applies a control current, the present FIG. 3 applies an injection current $I_4$ either directly to the left-most inductance of FIG. 3B or an injection current $I_A$ is injected at the same point via an interconnection line portions of which are electromagnetically coupled to the interferometer inductances. In addition, the values of inductance used in the present FIG. 3 and the ratio of the currents through its junctions may be different from the values given for the arrangement of FIG. 3B of the just-mentioned patent. Thus, the three-junction interferometer 10 of FIG. 3 includes three junctions J4, J5, J6 interconnected in parallel via inductances L1, L2, L3, L4 and forming a pair of loops M2, M3. Gate current $I_B$ is split between inductances L5, L6 in a symmetrical split feed configuration in inverse proportion to the value of inductances L5, L6. The resulting currents are applied between inductances L1, L2 and inductances L3, L4. A load resistance $R_L$ is disposed in parallel with interferometer 10 and may have a value of resistance which makes interferometer latching or self-resetting in a well-known way. As previously indicated, by applying gate current IB and injection current IA as shown in FIG. 3, a nonlinear switching or threshold characteristic similar to that shown at 8 in FIG. 2B is obtained. Consideration of threshold characteristic 8 in FIG. 2B shows that considerably sharper slopes are obtained relative to those obtained for threshold characteristic 4 which is that of a two-junction amplifier. From FIG. 2B, it should be clear that to achieve switching of the three-junction interferometer 10 of FIG. 3B even for the same gate current, $I_B$, considerably less injection current, $I_S$, can be utilized, thereby resulting in enhanced gain.

Referring again to FIG. 3 and substituting dashed line interconnection 11 for the solely end fed current injection approach just discussed, another approach for injecting current which includes electromagnetic field enhancement means can be utilized to provide even greater gains than that achieved previously. Portions 12 of interconnection line 11 shown as inductances in FIG. 3 are disposed in electromagnetically coupled relationship with the inductances L1, L2 and L3, L4 of loops M2, M3 of interferometer 10. Interconnection line 11 is now terminated at the left-most end of interferometer 10 and specifically at the left-most end of inductance L1. Thus, injection current, $I_A$ when applied to interconnection line 11 first couples a portion of the resulting magnetic field to inductances L1-L4 and from thence carries current $I_A$ to the point where it is injected into interferometer 10 at the left-most end of inductance L1. The magnetic field resulting from injection current $I_A$ effectively reduces the $I_{mo}$ of interferometer 10 further increasing the overall gain achievable in arrangements which have nonlinear gain characteristics. When characteristics 4 and 9 of FIG. 2B are compared, it can be clearly seen that for the same value of gate current, a higher gain is achieved for the two-junction interferometer of FIG. 2A with field enhancement than for the circuit of FIG. 2A without field enhancement.

The following are typical values for the parameters involved in the arrangement of FIG. 3 both with and without field enhancement.

Without Field Enhancement $I_B$ = 250 micro-amps
$I_A$ = 50 micro-amps
L1 = 6.28 pH
L2 = 6.28 pH
L3 = 6.28 pH
L4 = 6.28 pH
L5 = 32 pH
L6 = 18 pH
RL = 6Ω
IO(J4) = 64 micro-amps
IO(J5) = 127 micro-amps
IO(J6) = 159 micro-amps
Gain = 6

With Field Enhancement

For this mode, the same parameters can be utilized except that $I_A$ will be smaller resulting in a nominal gain of about 10.

The circuit of FIG. 3 is capable of providing gains in excess of ten and the parameters and configuration utilized are merely exemplary and are not intended to be limiting in any way. Thus, circuits similar to three-junction interferometer 10 may be designed having different values of inductances, different values of junction current or different values of gate or injection currents to provide gain characteristics which are generally nonlinear in character but which may be specifically different from those shown in FIG. 2B. Thus, depending on the application and the specific need, variation of any one or all of these parameters can be utilized to tailor the nonlinear switching characteristic of three-junction interferometers similar to interferometer 10 of FIG. 3. Indeed, it should be appreciated that additional junctions may be placed in parallel with the junctions J4-J6 of FIG. 3 without departing from the spirit of the present invention. Similarly, the injection of current need not be limited to a single point on the interferometer and a plurality of injection currents at different points on the interferometer may be utilized.

Figure 4A:
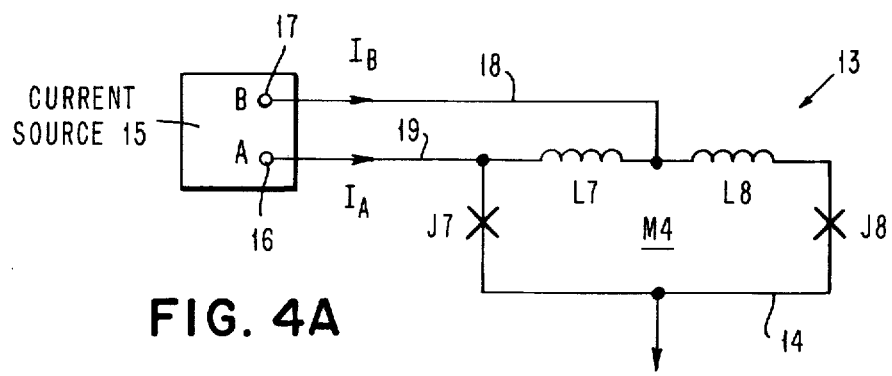
FIG. 4A is a schematic diagram of a two-junction interferometer which, because of the various values assigned to the parameters involved, acts as an AND logic circuit.

Referring now to FIG. 4A, there is shown a schematic diagram of a two-junction interferometer which, because of the values assigned to the parameters involved, acts as an AND logic circuit. The arrangement of FIG. 4A is an example of how tailoring of nonlinear switching or threshold characteristics may be achieved to accomplish a special purpose. The circuit of FIG. 4A addresses the situation where equal amplitude inputs are utilized to switch a two-junction interferometer 13 which is similar to interferometer 1 of FIG. 2A. It should be appreciated that in the interferometers previously discussed, the goal was amplification and, as such, the injected current is considerably smaller than the gate current. Thus, while the currents applied to interferometer 13 of FIG. 4A need not have the same amplitude, the amplitudes are normally selected to place the operating point of the circuit well outside the switching threshold so that the circuit has rather wide margins, that is, it is less subject to undesired operation due to variations in device parameters which occur during fabrication.

Figure 4C:
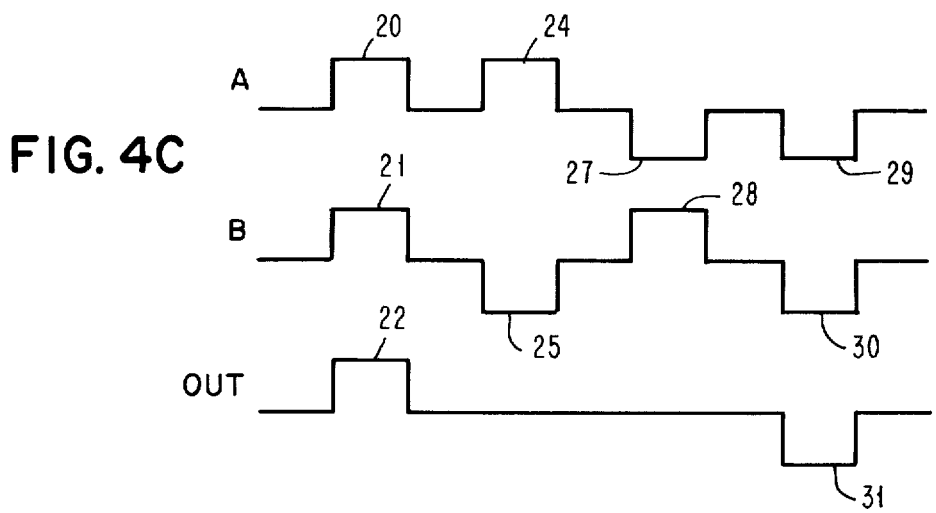
FIG. 4C shows the pulse trains which may be applied to inputs A and B of FIG. 4A and the output logic function which would appear across a load shunting the circuit of FIG. 4A.
Figure 4B:
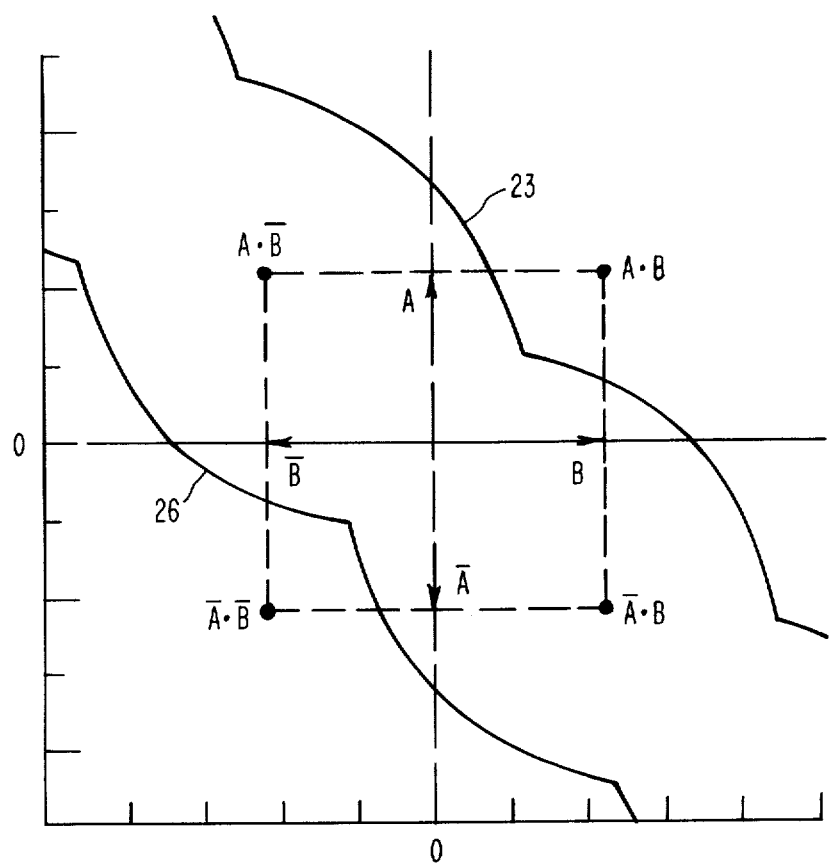
FIG. 4B is a graphical representation of the currents $I_A$ versus $I_B$ showing the switching or threshold characteristics of the AND circuit of FIG. 4A.

Referring to FIG. 4A in more detail, interferometer 13 is a two-junction interferometer having a configuration similar to that shown in FIG. 2A. Thus, interferometer 13 consists of a pair of junctions J7, J8 interconnected in parallel via inductances L7, L8 all of which taken together with an interconnection 14 forms a loop M4. Currents $I_B$, $I_A$ emanate from a current source indicated in FIG. 4A as block 15 and otherwise identified therein as Current Source. Current source 15 is capable of providing bipolar current pulses at terminals 16-17 which are otherwise identified in FIG. 4A by the reference characters A, B, respectively. Bipolar current $I_B$ is symmetrically fed to interferometer 13 via interconnection 18 while bipolar current $I_A$ is fed via interconnection 19 to the end of inductance L7. Typical values for the AND gate of FIG. 4A are as follows:

L7 = 5.9 pH
L8 = 2.4 pH
$I_{mo}(J7)$ = 100 micro-amps
$I_{mo}(J8)$ = 250 micro-amps
$I_A$ = 200 micro-amps
$I_B$ = 200 micro-amps Using the above values, the circuit of FIG. 4A has a nonlinear switching or threshold characteristic similar to that shown in FIG. 4B. FIG. 4B is a graphical representation of the currents $I_A$ versus $I_B$ showing the switching or threshold characteristics of the circuit of FIG. 4A in four quadrants. Considering FIG. 4B in connection with the pulse trains of FIG. 4C, it will be shown that various logic outputs can be obtained from a circuit similar to that of FIG. 4A depending upon the polarities of the input signals. As with the usual AND gate, if both inputs are present, an output will be obtained across a load associated with that logic circuit. Thus, if pulses 20, 21 of FIG. 4C are applied via interconnections 19, 18, respectively, to interferometer 13, an output 22 would be provided to an associated load (not shown) disposed in parallel with interferometer 13. In FIG. 4B, pulses 20, 21 are shown as currents A, B, respectively, on the Y and X axes, respectively, their vector summation providing an operating point A·B in the first quadrant. In FIG. 4B, operating point A·B is well outside the threshold or switching characteristic 23 providing very wide margins for AND gate 13.

Returning now to FIG. 4C, if pulses 24, 25 of positive and negative polarity, respectively, are applied via interconnections 19, 18, respectively, to interferometer 13, no output is provided. This can be clearly seen from a consideration of the second quadrant of the graphical representation of FIG. 4B wherein the application of currents A and $\overline{B}$ provide an operating point A·$\overline{B}$ in the second quadrant which remains within the boundaries of the switching threshold 23 and its mirror image switching threshold 26. In a similar way, if pulses 27, 28 of FIG. 4C are applied to interferometer 13 of FIG. 4A, no output is provided. Again, this is shown in the fourth quadrant of FIG. 4B wherein the application of currents $\overline{A}$,B provide an operating point $\overline{A}$·B which is within the switching thresholds 23, 26 of device 13. Finally, if pulses 29, 30 in FIG. 4C are applied to interferometer 13 of FIG. 4A, an output 31 is provided at a load-shunting interferometer 13. In FIG. 4B, the application of the pulses $\overline{A}$,$\overline{B}$ provides an operating point $\overline{A}$·$\overline{B}$ which in the third quadrant of the graph of FIG. 4B is well outside the switching or threshold characteristic 26 of device 13.

From the foregoing, it should be clear that the switching or threshold characteristic can be tailored to carry out a desired logic function by controlling the parameters of multi-junction interferometers wherein the basic nonlinearity is achieved by injecting a current into the interferometer at a point different from that where the usual device gate current is applied.

Figure 5A:
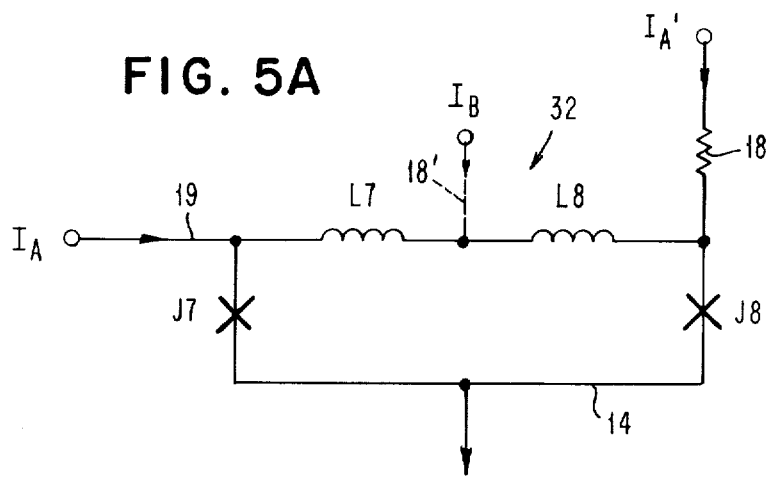
FIG. 5A is a schematic diagram of a two-junction interferometer to which the currents $I_A$, $I_{A'}$ are applied to obtain the OR function of these inputs at an output shunting the interferometer.

Referring now to FIG. 5A, there is shown a schematic diagram of a two-junction interferometer to which the currents $I_A$, $I_{A'}$ are applied to obtain the OR function of these inputs at an output (not shown) shunting the interferometer. The circuit of FIG. 5A is similar to the circuit of FIG. 4A and the same reference characters have been used in FIG. 5A to identify similar elements. Apart from the fact that the values of inductances L7, L8 and the currents through junctions J7, J8 are different, the overall configuration of interferometer 32 of FIG. 5A is the same as that of interferometer 13 of FIG. 4A except that the current $I_{A'}$ is fed via interconnection 18 to the right-most end of inductance L8.

Figure 5B:
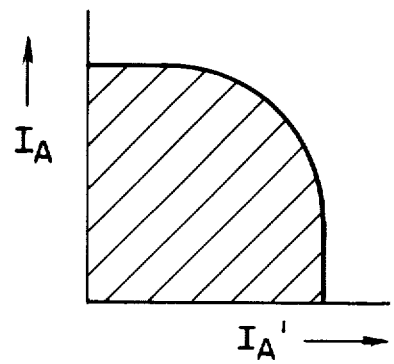
FIG. 5B is a graphical representation of the currents $I_A$ versus $I_{A'}$ showing the switching or threshold characteristic of the OR logic circuit of FIG. 5A.

The elements of FIG. 5A have the following values:

L7 = 2.8 pH
L8 = 2.8 pH
$I_{mo}(J7)$ = 175 micro-amps
$I_{mo}(J8)$ = 175 micro-amps
$I_A$ = 200 micro-amps
$I_{A'}$ = 200 micro-amps Using the values indicated, the circuit of FIG. 5A has a gain or switching characteristic like that shown in FIG. 5B. The amplitudes of currents $I_A$, $I_{A'}$ are such that if they are applied singly or in combination, the operating point of the circuit of FIG. 5A will always fall outside of switching characteristic 33 of FIG. 5B. The cross-hatched area under threshold characteristic 33 is an operating region wherein interferometer 32 is in the zero voltage state. Operating points which fall outside of threshold characteristic 33 place interferometer 32 of FIG. 5A in the switched or voltage state. The currents applied to interferometer 32 have been characterized as $I_A$, $I_{A'}$ because they both may be considered to be injection currents. To conform this circuit to what has gone before, an interconnection shown by dashed line 18' can be symmetrically connected to interferometer 32 to apply a gate current $I_B$ thereto. In the particular circuit of FIG. 5A, current $I_B$ is equal to zero.

Again, it can be clearly seen that by adjusting interferometer parameters in a circuit which has a nonlinear gain characteristic, that gain characteristic can be tailored in such a way as to provide many different gain characteristics which can provide either signal amplification or different logical outputs.

Figure 6:
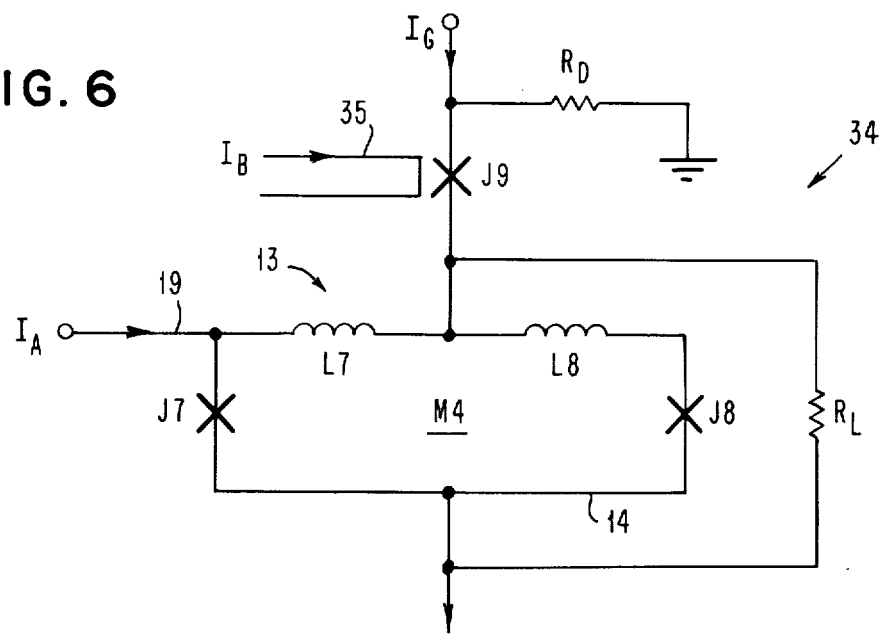
FIG. 6 is a schematic representation of an inhibit circuit which incorporates a two-junction interferometer utilizing the nonlinear current injection teaching of the present invention.

Referring now to FIG. 6, there is shown a schematic representation of an inhibit circuit which incorporates a two-junction interferometer utilizing the nonlinear current injection teaching of the present invention. Inhibit circuit 34 includes a two-junction interferometer having a configuration similar to that shown in FIG. 4A. Similar elements in FIG. 6 have been given the same reference characters as those shown in FIG. 4A. Interferometer 13 shown shunted by a load $R_L$ is disposed in series with a Josephson device J9 which may be an interferometer; the switching of which is controlled by a control line 35 disposed in electromagnetically coupled relationship with device J9. Device J9 is disposed in series with a current source (not shown) which provides a gate current to device J9. Device J9 is shunted by a terminating resistor $R_D$. Control line 35 is controlled by a current $I_B$ while current $I_A$ is injected via interconnection 19 into interferometer 13.

Interferometer 13 operates in the same manner as described in connection with FIG. 4A except that its gate current $I_G$ may be eliminated by applying current $I_B$ to control line 35 of device J9 thereby switching that device and diverting current $I_G$ into load $R_D$. Using the foregoing approach, the AND gate of FIG. 4A may be converted to an inhibit circuit. It should be appreciated that the amplifier circuit of FIG. 2A may be substituted for interferometer 13 of FIG. 6 without departing from the teaching of the present invention.

Figure 7:
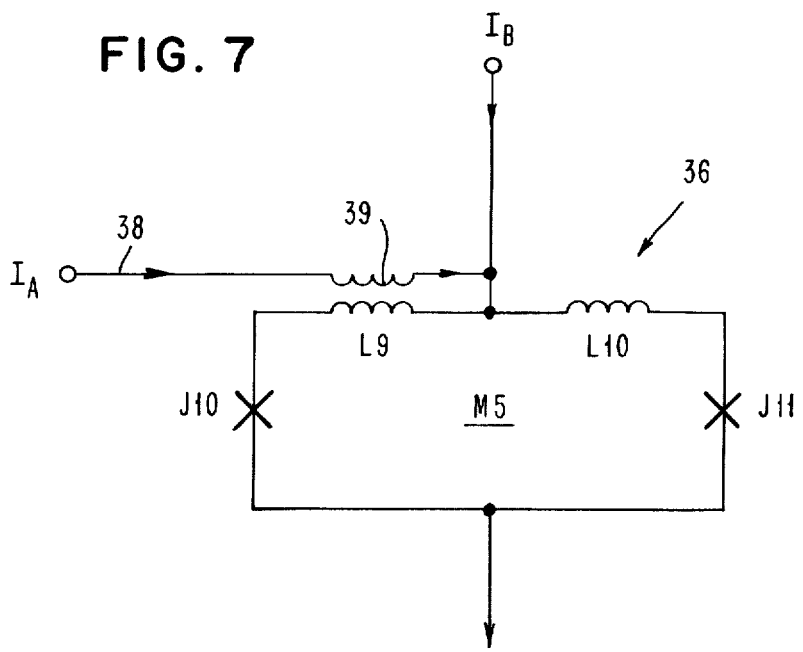
FIG. 7 is a schematic diagram of a two-junction interferometer amplifier circuit which is equivalent to the circuit of FIG. 4A, which utilizes an injected current which is directly connected to the same feed point as the gate current of the device. It has a nonlinear threshold characteristic as a result of electromagnetic coupling of a portion of the injection current to the interferometer.

Referring now to FIG. 7, there is shown a schematic diagram of a twojunction interferometer amplifier circuit which is the equivalent of a circuit similar to that shown in FIG. 2A. The interferometer of FIG. 7 utilizes an injected current which is directly connected to the same feed point as the gate current of the device. The interferometer has, however, a nonlinear threshold characteristic as a result of the electromagnetic coupling of a portion of the injected current to the interferometer. Referring to FIG. 7 in more detail, interferometer 36 consists of junctions J10, J11 disposed in parallel and interconnected by means of inductances L9, L10. These elements along with interconnection 37 form a loop M5 to which a gate current $I_B$ is applied. Injection current $I_A$ is applied to the same electrical point on interferometer 36 via an interconnection 38, a portion 39 of which is disposed in electromagnetically coupled relationship with inductance L9. To the extent that currents $I_A$, $I_B$ are fed to the same point electrically on interferometer 36, there is a linear summation of these currents in interferometer 36. However, current $I_A$ which is in portion 39 of interconnection 38 is electromagnetically coupled to inductance L9 and a current is set up therein which has the same direction and magnitude as if it were applied to the left-most extremity of inductance L9. As a consequence, the induced current and the summed injection currents interact in a complex way to provide a nonlinear switching threshold which is similar to characteristic 4 shown in FIG. 2B. The circuit of FIG. 7 is not equivalent to well-known interferometer circuits which incorporate a control line which is utilized to reduce the $I_{mo}$ of an associated interferometer. As has been previously indicated, nonlinearities result from such an interaction but they are of such a character that they become washed out in overlapping modes and serve no useful function. While it is not shown in FIG. 7 or any of the other devices described hereinabove, a control line of the usual type may be disposed in solely electromagnetically coupled relationship with the interferometers in order to control the $I_{mo}$ of the interferometers without affecting the obtaining of a nonlinear switching or threshold characteristic in accordance with the teaching of the present application. In fact, the nonlinearities can be tailored as a function of the current, $I_C$, in the added control line.

The interferometer circuits described hereinabove may be fabricated in the same manner as described in U.S. Pat. No. 3,978,315 mentioned hereinabove. More specifically, the interferometer devices and circuits described herein may be fabricated in accordance with fabrication techniques well-known to those skilled in the Josephson and semiconductor technologies. Thus, the metallic layers are formed by well-known vacuum deposition techniques; junctions oxides are formed and their thicknesses controlled by a sputtering technique taught in U.S. Pat. No. 3,849,276 in the name of J. Greiner and assigned to the same assignee as the assignee of the present invention; other oxides are formed by well-known evaporation techniques and the latter, along with the various metal layers, are delineated using well-known photolithographic masking and etching techniques. Since the fabrication technique forms no part of the present invention, it is believed that the foregoing description, which invokes well-known prior art techniques and patents, is sufficient for one skilled in the art to fabricate devices of the character described hereinabove.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A Josephson tunneling circuit comprising:
   an interferometer capable of exhibiting a nonlinear switching characteristic and having at least a pair of junctions capable of carrying Josephson current and at least an inductance interconnecting said junctions, and,
   means directly connected to said interferometer for producing said nonlinear switching characteristic.

2. A Josephson tunneling circuit according to claim 1 wherein said means directly connected to said interferometer includes means for applying a gate current to at least a given point on said interferometer, and means for applying at least an injection current to at least a point on said interferometer different from said given point.

3. A Josephson tunneling circuit according to claim 1 wherein said means directly connected to said interferometer includes means for applying a gate current to at least a given point on said interferometer, and, means for simultaneously applying at least an injection current to said at least a given point and inducing at least an additional current from said at least an injection current into at least a portion of said at least an inductance.

4. A Josephson tunneling circuit according to claim 1 wherein said means directly connected to said interferometer includes means for applying gate current to said at least a given point on said interferometer, and, means for simultaneously applying at least an injection current to at least a point on said interferometer different from said given point and inducing at least an additional current from said at least an injection current into at least a portion of said at least an inductance.

5. A Josephson tunneling circuit according to claim 1 wherein said means directly connected to said interferometer includes means for applying at least a pair of injection currents to different points on said interferometer.

6. A Josephson tunneling circuit according to claim 1 further including a load impedance shunting said interferometer.

7. A Josephson tunneling circuit according to claim 1 wherein said producing means includes means for applying currents of different amplitude to said interferometer.

8. A Josephson tunneling circuit according to claim 1 wherein said producing means includes means for applying currents of different amplitude to said interferometer.

9. A Josephson tunneling circuit according to claim 2 wherein said at least a given point is on said at least an inductance and splits said at least an inductance symmetrically.

10. A Josephson tunneling circuit according to claim 2 wherein said at least a give point is on said at least an inductance and splits said at least an inductance asymmetrically.

11. A Josephson tunneling circuit according to claim 2 wherein said means for applying a gate current to a given point on said interferometer includes a current carrying interconnection connected symmetrically to said at least an inductance splitting said at least an inductance into at least two portions having different values of inductance.

12. A Josephson tunneling circuit according to claim 2 wherein said means for applying a gate current to at least a given point on said interferometer includes at least a current carrying interconnection connected symmetrically to said at least an inductance splitting said at least an inductance into at least two portions having the same values of inductance.

13. A Josephson tunneling circuit according to claim 2 wherein said means for applying at least a gate current to at least a given point on said interferometer includes at least a current carrying interconnection connected asymmetrically to said at least an inductance splitting said at least an inductance into at least two portions having different values of inductance.

14. A Josephson tunneling circuit according to claim 2 wherein said means for applying at least an injection current to at least a point on said interferometer different from said at least a given point includes at least a current carrying conductor connected to one extremity of said at least an inductance.

15. A Josephson tunneling circuit according to claim 2 wherein said means for applying at least an injection current to at least a point on said interferometer different from said at least a given point includes at least a current carrying conductor connected to said at least an inductance between said at least a given point and an extremity of said at least an inductance.

16. A Josephson tunneling circuit according to claim 3 wherein said at least a given point is on said at least an inductance and splits said at least an inductance symmetrically.

17. A Josephson tunneling circuit according to claim 3 wherein said at least a given point is on said at least an inductance and splits said at least an inductance asymmetrically.

18. A Josephson tunneling circuit according to claim 3 wherein said means for applying a gate current to at least a given point on said interferometer includes at least a current carrying interconnection connected symmetrically to said at least an inductance splitting said at least an inductance into at least two portions having different values of inductance.

19. A Josephson tunneling circuit according to claim 3 wherein said means for applying a gate current to at least a given point on said interferometer includes at least a current carrying interconnection connected symmetrically to said at least an inductance splitting said at least an inductance into at least two portions having the same values of inductance.

20. A Josephson tunneling circuit according to claim 3 wherein said means for applying at least a gate current to at least a given point on said interferometer includes at least a current carrying interconnection connected asymmetrically to said at least an inductance splitting said at least an inductance into at least two portions having different values of inductance.

21. A Josephson tunneling circuit according to claim 3 wherein said means for simultaneously applying at least an injection current and inducing at least an additional current into at least a portion of said at least an inductance includes at least a current carrying conductor connected to said at least a given point at least a portion of said at least a current carrying conductor being disposed in electromagnetically coupled relationship with at least a portion of said at least an inductance.

22. A Josephson tunneling circuit according to claim 4 wherein said at least a given point is on said at least an inductance and splits said at least an inductance symmetrically.

23. A Josephson tunneling circuit according to claim 4 wherein said at least a given point is on said at least an inductance and splits said at least an inductance asymmetrically.

24. A Josephson tunneling circuit according to claim 4 wherein said means for applying a gate current to at least a given point on said interferometer includes at least a current carrying interconnection connected symmetrically to said at least an inductance splitting said at least an inductance into at least two portions having different values of inductance.

25. A Josephson tunneling circuit according to claim 4 wherein said means for applying a gate current to at least a given point on said interferometer includes at least a current carrying interconnection connected symmetrically to said at least an inductance splitting said at least an inductance into at least two portions having the same values of inductance.

26. A Josephson tunneling circuit according to claim 4 wherein said means for applying at least a gate current to at least a given point on said interferometer includes at least a current carrying interconnection connected asymmetrically to said at least an inductance splitting said at least an inductance into at least two portions having different values of inductance.

27. A Josephson tunneling circuit according to claim 4 wherein said means for simultaneously applying at least an injection current and inducing at least an additional current into at least a portion of said at least an inductance includes at least a current carrying conductor connected to one extremity of said inductance at least a portion of said at least a current carrying conductor being disposed in electromagnetically coupled relationship with at least a portion of said at least an inductance.

28. A Josephson tunneling circuit according to claim 4 wherein said means for simultaneously applying at least an injection current and inducing at least an additional current into at least a portion of said at least an inductance includes at least a current carrying conductor connected to said at least an inductance between said at least a given point and an extremity of said at least an inductance at least a portion of said at least a current carrying conductor being disposed in electromagnetically coupled relationship with at least a portion of said at least an inductance.

29. A Josephson tunneling circuit according to claim 5 wherein said means for applying at least a pair of injection currents to different points on said interferometer includes at least a pair of current carrying interconnections each of which is connected to a different extremity of said at least an inductance.

30. A Josephson tunneling circuit comprising:
an interferometer capable of exhibiting a nonlinear switching characteristic having at least a pair of junctions capable of carrying Josephson current and at least an inductance interconnecting said junctions, and,
current means directly connected to said interferometer for producing said nonlinear switching characteristic.

31. A Josephson tunneling circuit according to claim 30 wherein said current means directly connected to said interferometer includes means for applying a first current to at least a given point on said interferometer, and means for applying at least a second current to at least a point on said interferometer different from said given point.

32. A Josephson tunneling circuit according to claim 30 wherein said current means directly connected to said interferometer includes means for applying a first current to at least a given point on said interferometer, and, means for simultaneously applying at least a second current to said at least a given point and inducing at least an additional current from said at least an injection current into at least a portion of said at least an inductance.

33. A Josephson tunneling circuit according to claim 30 wherein said current means directly connected to said interferometer includes means for applying gate current to said at least a given point on said interferometer, and, means for simultaneously applying at least an injection current to at least a point on said interferometer different from said given point and inducing at least an additional current from said at least an injection current into at least a portion of said at least an inductance.

34. A Josephson tunneling circuit according to claim 30 further including at least a single control line disposed in electromagnetically coupled relationship with said interferometer.

* * * * *